United States Patent
Lv

(10) Patent No.: US 9,041,002 B2
(45) Date of Patent: May 26, 2015

(54) TFT-LCD ARRAY SUBSTRATE AND DISPLAY DEVICE EACH WITH DATA LINE ON COMMON ELECTRODE LINE HAVING LARGER DIMENSION THAN THE DATA LINE

(71) Applicant: Shenzhen China Star Optoelectronics Technology Co., Ltd., Shenzhen, Guangdong (CN)

(72) Inventor: Qibiao Lv, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/233,751

(22) PCT Filed: Jul. 18, 2013

(86) PCT No.: PCT/CN2013/079618
§ 371 (c)(1),
(2) Date: Jan. 19, 2014

(87) PCT Pub. No.: WO2015/003406
PCT Pub. Date: Jan. 15, 2015

(65) Prior Publication Data
US 2015/0014690 A1 Jan. 15, 2015

(30) Foreign Application Priority Data
Jul. 11, 2013 (CN) .......................... 2013 1 0290728

(51) Int. Cl.
H01L 27/14 (2006.01)
H01L 29/15 (2006.01)
H01L 31/036 (2006.01)
G02F 1/1343 (2006.01)
G02F 1/1368 (2006.01)
G02F 1/1333 (2006.01)
G02F 1/1335 (2006.01)
G02F 1/1362 (2006.01)
H01L 27/12 (2006.01)

(52) U.S. Cl.
CPC ........ *G02F 1/134309* (2013.01); *G02F 1/1368* (2013.01); *G02F 1/133345* (2013.01); *G02F 1/133514* (2013.01); *G02F 1/136286* (2013.01); *H01L 27/1237* (2013.01)

(58) Field of Classification Search
None
See application file for complete search history.

(56) References Cited

U.S. PATENT DOCUMENTS

2008/0211980 A1* 9/2008 Shin et al. ...................... 349/39
2010/0264417 A1* 10/2010 Yoon et al. ...................... 257/59
2011/0255045 A1* 10/2011 Son et al. ...................... 349/139
2012/0154723 A1* 6/2012 Chang et al. .................. 349/106

* cited by examiner

*Primary Examiner* — Michael Jung
(74) *Attorney, Agent, or Firm* — Andrew C. Cheng

(57) ABSTRACT

A TFT-LCD array substrate is disclosed. The TFT-LCD array substrate includes a substrate and a thin film transistor (TFT) on the substrate, at least one pixel electrode, and a passivation layer. The passivation layer covers the gate insulation layer. The pixel electrode is arranged on the passivation layer. At least one portion between the gate insulation layer and the substrate is arranged with common electrode lines. At least one data line is arranged between the gate insulation layer and the passivation layer. The data line is arranged on the common electrode line. The common electrode line blocks the data line. In addition, a corresponding liquid crystal device is also disclosed. With the TFT-LCD array substrate and the liquid crystal device, not only the light leakage is avoided, but also the crosstalk resulting from the light leakage is also avoided.

8 Claims, 1 Drawing Sheet

TFT-LCD ARRAY SUBSTRATE AND DISPLAY DEVICE EACH WITH DATA LINE ON COMMON ELECTRODE LINE HAVING LARGER DIMENSION THAN THE DATA LINE

This application claims priority to China Patent Application No. 201310290728.8 filed on Jul. 11, 2013 entitled, TFT-LCD ARRAY SUBSTRATE AND DISPLAY DEVICE, all of the disclosures of which are incorporated herein by reference in their entirety.

BACKGROUND OF THE INVENTION

1. Field of the Invention

Embodiments of the present disclosure relate to Thin Film Transistor Liquid Crystal Display (TFT-LCD) technology, and more particularly to a display device.

2. Discussion of the Related Art

In the TFT-LCD manufacturing process, the array substrate and the color filter (CF) substrate are separately manufactured, and then are aligned together to be a cell. Displacement and bent glasses may occur due to alignment precision. In addition, the displacement may result in light leakage, low transmission rate and V-Crosstalk. Especially, the large-scale glasses may be easily bent and thus the light leakage happens.

FIG. 1 is a schematic view of one conventional TFT-LCD array substrate. The TFT-LCD array substrate includes a substrate 1, a gate insulation layer 3 on the substrate 1, a pixel electrode 6 and a passivation layer 5. The passivation layer 5 covers the gate insulation layer 3. The pixel electrode 6 is arranged on the passivation layer 5. A common electrode line 2 is arranged between the gate insulation layer 3 and the substrate 1. A data line 4 is arranged between the gate insulation layer 3 and the passivation layer 5. The data line 4 is arranged on the common electrode line 2, and the data line 4 and the common electrode line 2 are interleaved with each other. A gap is arranged between the common electrode line 2 and the data line 4. Generally, when the displacement between the array substrate and the CF occurs, light leakage also occurs in the gap between the common electrode line 2 and the data line 4. Thus, there is a need to solve the light leakage issue of the TFT-LCD array substrate.

SUMMARY

The object of the claimed invention is to provide a TFT-LCD array substrate and the display device to reduce the light leakage issue of the TFT-LCD array substrate so as to enhance the yield rate.

In one aspect, a TFT-LCD array substrate includes: a substrate and a thin film transistor (TFT) on the substrate, at least one pixel electrode, and a passivation layer; the TFT includes at least a gate insulation layer covered by the passivation layer, the pixel electrode being arranged on the passivation layer; and at least one portion between the gate insulation layer and the substrate being arranged with common electrode lines, at least one data line being arranged between the gate insulation layer and the passivation layer, the data line being arranged on the common electrode line, and a corresponding dimension of the common electrode line is larger than the corresponding dimension of the data line, and the common electrode line blocks the data line.

Wherein the gate insulation layer is of a double-layer structure, and a color filter layer is arranged between the two gate insulation layers.

Wherein an amorphous silicon layer is arranged between the gate insulation layer and the data line.

Wherein the amorphous silicon layer is manufactured by a low-temperature process.

Wherein the color filter layer is of a single-layer structure, and the color filter layer is a red (R) color filter layer, a green (G) color filter layer, or blue (B) color filter layer.

Wherein the color filter layer is an integrated color filter layer comprising any two of the red (R) color filter layer, a green (G) color filter layer, and blue (B) color filter layer.

Wherein the TFT further includes a gate between the substrate and the gate insulation layer, and an active layer, a source and a gate between the gate insulation layer and the passivation layer.

Wherein the data line electrically connects to the source.

In another aspect, a TFT-LCD array substrate includes: a substrate and a thin film transistor (TFT) on the substrate, at least one pixel electrode, and a passivation layer; the TFT includes at least a gate insulation layer covered by the passivation layer, and the pixel electrode being arranged on the passivation layer; at least one portion between the gate insulation layer and the substrate being arranged with common electrode lines, at least one data line being arranged between the gate insulation layer and the passivation layer, the data line being arranged on the common electrode line, and a corresponding dimension of the common electrode line is larger than the corresponding dimension of the data line, and the common electrode line blocks the data line; and the gate insulation layer is of a double-layer structure, and a color filter layer is arranged between the two gate insulation layers.

Wherein an amorphous silicon layer is arranged between the gate insulation layer and the data line.

Wherein the amorphous silicon layer is manufactured by a low-temperature process.

Wherein the color filter layer is of a single-layer structure, and the color filter layer is a red (R) color filter layer, a green (G) color filter layer, or blue (B) color filter layer.

Wherein the color filter layer is an integrated color filter layer comprising any two of the red (R) color filter layer, a green (G) color filter layer, and blue (B) color filter layer.

Wherein the TFT further includes a gate between the substrate and the gate insulation layer, and an active layer, a source and a gate between the gate insulation layer and the passivation layer.

Wherein the data line electrically connects to the source.

In another aspect, a display device includes a TFT-LCD array substrate. The TFT-LCD array substrate includes: the TFT includes at least a gate insulation layer covered by the passivation layer, the pixel electrode being arranged on the passivation layer; at least one portion between the gate insulation layer and the substrate being arranged with common electrode lines, at least one data line being arranged between the gate insulation layer and the passivation layer, the data line being arranged on the common electrode line, and a corresponding dimension of the common electrode line is larger than the corresponding dimension of the data line, and the common electrode line blocks the data line; and the gate insulation layer is of a double-layer structure, and a color filter layer is arranged between the two gate insulation layers.

Wherein an amorphous silicon layer is arranged between the gate insulation layer and the data line.

Wherein the amorphous silicon layer is manufactured by a low-temperature process.

Wherein the color filter layer is of a single-layer structure, and the color filter layer is a red (R) color filter layer, a green (G) color filter layer, or blue (B) color filter layer.

Wherein the color filter layer is an integrated color filter layer comprising any two of the red (R) color filter layer, a green (G) color filter layer, and blue (B) color filter layer.

In view of the above, the data line is arranged on the common electrode line. A corresponding dimension of the common electrode line is larger than the corresponding dimension of the data line. The common electrode line blocks the data line such that there is no gap between the common electrode line and the data line. In this way, not only the light leakage is avoided, but also the crosstalk resulting from the light leakage is also avoided.

At the same time, a color filter layer is arranged within the TFT-LCD array substrate such that the distance between the common electrode line and the data line is enlarged, which greatly decrease the capacitance between the common electrode line and the data line. As such, the loading on the data line is reduced so as to avoid the undesirable display and to reduce the power consumption of the panel.

BRIEF DESCRIPTION OF THE DRAWINGS

Below in conjunction with the accompanying drawings, through a specific embodiment of the present invention is described in detail, and will make apparent the technical solution of the present invention, and other beneficial effects.

DETAILED DESCRIPTION OF THE EMBODIMENTS

Embodiments of the invention will now be described more fully hereinafter with reference to the accompanying drawings, in which embodiments of the invention are shown.

Figure 1:
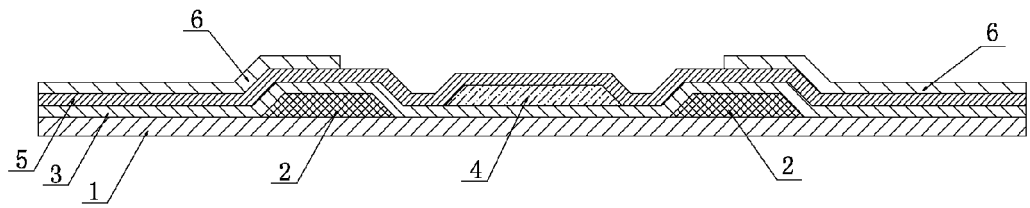
FIG. 1 is a schematic view of one conventional TFT-LCD array substrate.
Figure 2:
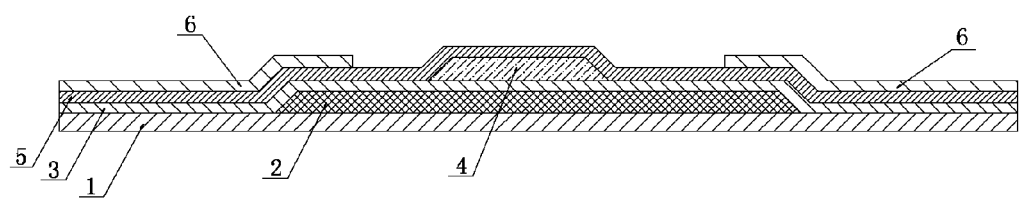
FIG. 2 is a schematic view of a TFT-LCD array substrate in accordance with one embodiment.

FIG. 2 is a schematic view of a TFT-LCD array substrate in accordance with one embodiment. The TFT-LCD array substrate includes a substrate 1, a thin film transistor (TFT) arranged on the substrate 1, a pixel electrode 6 and a passivation layer 5. The TFT includes at least one gate insulation layer 3. The passivation layer 5 covers the gate insulation layer 3. The pixel electrode 6 is arranged on the passivation layer 5.

At least one portion between the gate insulation layer 3 and the substrate 1 is arranged with common electrode lines 2. At least one data line 4 is arranged between the gate insulation layer 3 and the data line 4. The data line 4 is arranged on the common electrode line 2. The corresponding dimension of the common electrode line 2 is larger than that of the data line 4. The common electrode line 2 blocks the data line 4.

It can be understood that FIG. 2 is the cross sectional view of partial TFT-LCD array substrate. The components of the TFT, in addition to the gate insulation layer 3, are not shown in FIG. 2. In one embodiments, the TFT further includes a gate between the substrate 1 and the gate insulation layer 3, and an active layer, a source and a gate between the gate insulation layer 3 and the passivation layer 5. The data line 4 electrically connects to the source.

Figure 3:
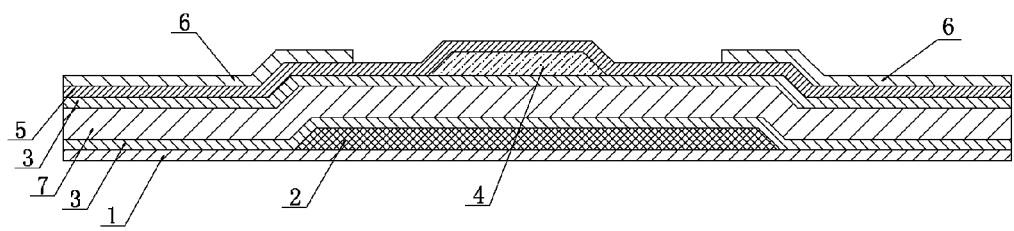
FIG. 3 is a schematic view of the TFT-LCD array substrate in accordance with another embodiment.

FIG. 3 is a schematic view of the TFT-LCD array substrate in accordance with another embodiment. In this embodiment, the gate insulation layer 3 is a double-layer structure. A color filter layer 7 is arranged between the two gate insulation layers 3. It can be understood that the color filter layer 7 may be of a single-layer structure. For example, the color filter layer 7 may be a red (R) color filter layer, a green (G) color filter layer, or blue (B) color filter layer. In other embodiments, the color filter layer 7 may be an integrated color filter layer including any two of the red (R) color filter layer, a green (G) color filter layer, and blue (B) color filter layer. For example, the color filter layer 7 includes the red (R) and the blue (B) color filter layers, or the green (G) and the blue (B) color filter layers, or the red (R) and the blue (B) color filter layers. As the color filter layer 7 has a smaller dielectric constant and a thicker thickness, the distance between the common electrode line 2 and the data line 4 is enlarged, which greatly decrease the capacitance between the common electrode line 2 and the data line 4. As such, the loading on the data line 4 is reduced so as to avoid the undesirable display and to reduce the power consumption of the panel.

In the embodiments, the structure of other layers of the TFT-LCD array substrate are the same with those disclosed in FIG. 2.

Figure 4:
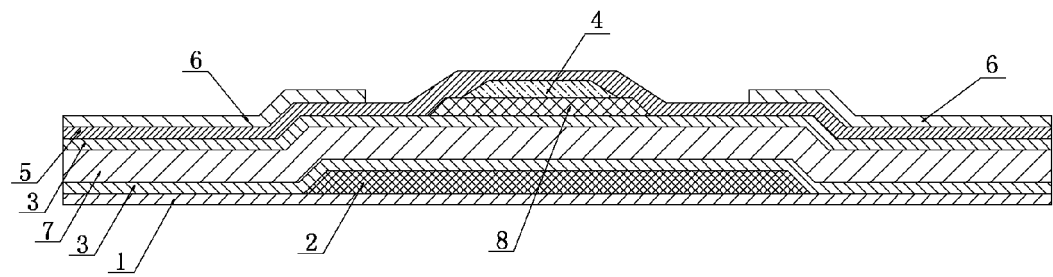
FIG. 4 is a schematic view of the TFT-LCD array substrate in accordance with another embodiment.

FIG. 4 is a schematic view of the TFT-LCD array substrate in accordance with another embodiment. In the embodiment, an amorphous silicon layer 8 is arranged between the gate insulation layer 3 and the data line 4. In order to prevent the color filter layer 7 from being damaged due to high temperature, the amorphous silicon layer 8 is manufactured by a low-temperature process.

In one embodiment, one TFT-LCD adopts the TFT-LCD array substrate disclosed in FIGS. 2 to 4.

In view of the above, the data line is arranged on the common electrode line. The corresponding dimension of the common electrode line is larger than that of the data line. The common electrode line blocks the data line such that there is no gap between the common electrode line and the data line. Thus, not only the light leakage is avoided, but also the crosstalk resulting from the light leakage is also avoided.

At the same time, the TFT-LCD array substrate includes the color filter layer to increase the distance between the common electrode line and the data line so as to reduce the capacitance between the common electrode line and the data line. As such, the loading on the data line is reduced so as to avoid the undesirable display and to reduce the power consumption of the panel.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A TFT-LCD array substrate, comprising:
    a substrate and a thin film transistor (TFT) on the substrate, at least one pixel electrode, and a passivation layer;
    the TFT comprises at least a gate insulation layer covered by the passivation layer, and the pixel electrode being arranged on the passivation layer;
    at least one portion between the gate insulation layer and the substrate being arranged with at least one common electrode line, at least one data line being arranged between the gate insulation layer and the passivation layer, the data line being arranged on the common electrode line, and a corresponding dimension of the common electrode line is larger than the corresponding dimension of the data line, and the common electrode line blocks the data line;

the gate insulation layer is of a double-layer structure, and a color filter layer is arranged between the double-layer structure of the gate insulation layer; and wherein the color filter layer is of a single-layer structure, and the color filter layer is a red (R) color filter layer, a green (G) color filter layer, or blue (B) color filter layer.

2. The TFT-LCD array substrate as claimed in claim 1, wherein an amorphous silicon layer is arranged between the gate insulation layer and the data line.

3. A TFT-LCD array substrate, comprising:
    a substrate and a thin film transistor (TFT) on the substrate, at least one pixel electrode, and a passivation layer;
    the TFT comprises at least a gate insulation layer covered by the passivation layer, and the pixel electrode being arranged on the passivation layer;
    at least one portion between the gate insulation layer and the substrate being arranged with at least one common electrode line, at least one data line being arranged between the gate insulation layer and the passivation layer, the data line being arranged on the common electrode line, and a corresponding dimension of the common electrode line is larger than the corresponding dimension of the data line and the common electrode line blocks the data line;
    the gate insulation layer is of a double-layer structure, and a color filter layer is arranged between the double-layer structure of the gate insulation layer; and
    wherein the color filter layer is an integrated color filter layer comprising any two of the red (R) color filter layer, a green (G) color filter layer, and blue (B) color filter layer.

4. The TFT-LCD array substrate as claimed in claim 3, wherein the TFT further comprises a gate between the substrate and the gate insulation layer, and an active layer, a source and a gate between the gate insulation layer and the passivation layer.

5. The TFT-LCD array substrate as claimed in claim 4, wherein the data line electrically connects to the source.

6. A display device comprises a TFT-LCD array substrate, the TFT-LCD array substrate comprising:
    the TFT comprises at least a gate insulation layer covered by the passivation layer, the pixel electrode being arranged on the passivation layer;
    at least one portion between the gate insulation layer and the substrate being arranged with common electrode lines, at least one data line being arranged between the gate insulation layer and the passivation layer, the data line being arranged on the common electrode line, and a corresponding dimension of the common electrode line is larger than the corresponding dimension of the data line, and the common electrode line blocks the data line;
    the gate insulation layer is of a double-layer structure, and a color filter layer is arranged between the double-layer structure of the gate insulation layer; and
    wherein the color filter layer is of a single-layer structure, and the color filter layer is a red (R) color filter layer, a green (G) color filter layer, or blue (B) color filter layer.

7. The display device as claimed in claim 6, wherein an amorphous silicon layer is arranged between the gate insulation layer and the data line.

8. A display device, comprises a TFT-LCD array substrate, the TFT-LCD array substrate comprising:
    the TFT comprises at least a gate insulation layer covered by the passivation layer, the pixel electrode being arranged on the passivation layer;
    at least one portion between the gate insulation layer and the substrate being arranged with common electrode lines, at least one data line being arranged between the gate insulation layer and the passivation layer the data line being arranged on the common electrode line, and a corresponding dimension of the common electrode line is larger than the corresponding dimension of the data line, and the common electrode line blocks the data line;
    the gate insulation layer is of a double-layer structure, and a color filter layer is arranged between the double-layer structure of the gate insulation layer; and
    wherein the color filter layer is an integrated color filter layer comprising any two of the red (R) color filter layer, a green (G) color filter layer, and blue (B) color filter layer.

* * * * *